US007903449B2

(12) United States Patent
Kajigaya et al.

(10) Patent No.: US 7,903,449 B2
(45) Date of Patent: Mar. 8, 2011

(54) SEMICONDUCTOR MEMORY DEVICE

(75) Inventors: Kazuhiko Kajigaya, Chuo-ku (JP);
Soichiro Yoshida, Chuo-ku (JP);
Tomonori Sekiguchi, Chiyoda-ku (JP);
Riichiro Takemura, Chiyoda-ku (JP);
Yasutoshi Yamada, Chiyoda-ku (JP)

(73) Assignee: Elpida Memory, Inc., Tokyo (JP)

( * ) Notice: Subject to any disclaimer, the term of this patent is extended or adjusted under 35 U.S.C. 154(b) by 79 days.

(21) Appl. No.: 12/485,568

(22) Filed: Jun. 16, 2009

(65) Prior Publication Data
US 2009/0323399 A1 Dec. 31, 2009

(30) Foreign Application Priority Data

Jun. 26, 2008 (JP) ................................ 2008-167059

(51) Int. Cl.
*G11C 11/24* (2006.01)
(52) U.S. Cl. .................. 365/149; 365/210.1; 365/210.15
(58) Field of Classification Search .............. 365/210.15
See application file for complete search history.

(56) References Cited

U.S. PATENT DOCUMENTS

| 5,574,694 | A | * | 11/1996 | von der Ropp | ............... 365/203 |
| 5,682,343 | A | * | 10/1997 | Tomishima et al. | ............ 365/63 |
| 7,196,945 | B2 | * | 3/2007 | Kato | ........................ 365/189.07 |
| 7,379,316 | B2 | * | 5/2008 | Rajan | .............................. 365/63 |

FOREIGN PATENT DOCUMENTS

| JP | 05-174578 A | 7/1993 |
| JP | 11-214649 A | 8/1999 |
| JP | 2000-348488 A | 12/2000 |
| JP | 2003-332532 A | 11/2003 |
| JP | 2005-167039 A | 6/2005 |

\* cited by examiner

*Primary Examiner* — Tan T. Nguyen
(74) *Attorney, Agent, or Firm* — Sughrue Mion, PLLC

(57) ABSTRACT

A semiconductor memory device (e.g. DRAM) is constituted of a memory cell array including a plurality of memory cells, a plurality of word line drivers, a plurality of sense amplifiers, and a plurality of dummy capacitors. The memory cells, each of which includes a transistor and a capacitor, are positioned at intersections between the word lines and the bit lines. The first electrodes of the capacitors are connected to the transistors in the memory cells. The first electrodes of the dummy capacitors are connected together and are supplied with a second potential (e.g. VDD or VSS). The second electrodes of the dummy capacitors are connected together with the second electrodes of the capacitors of the memory cells and are supplied with a first potential (e.g. VPL). The dummy capacitors serve as smoothing capacitances for the plate voltage VPL so as to reduce plate noise.

20 Claims, 6 Drawing Sheets

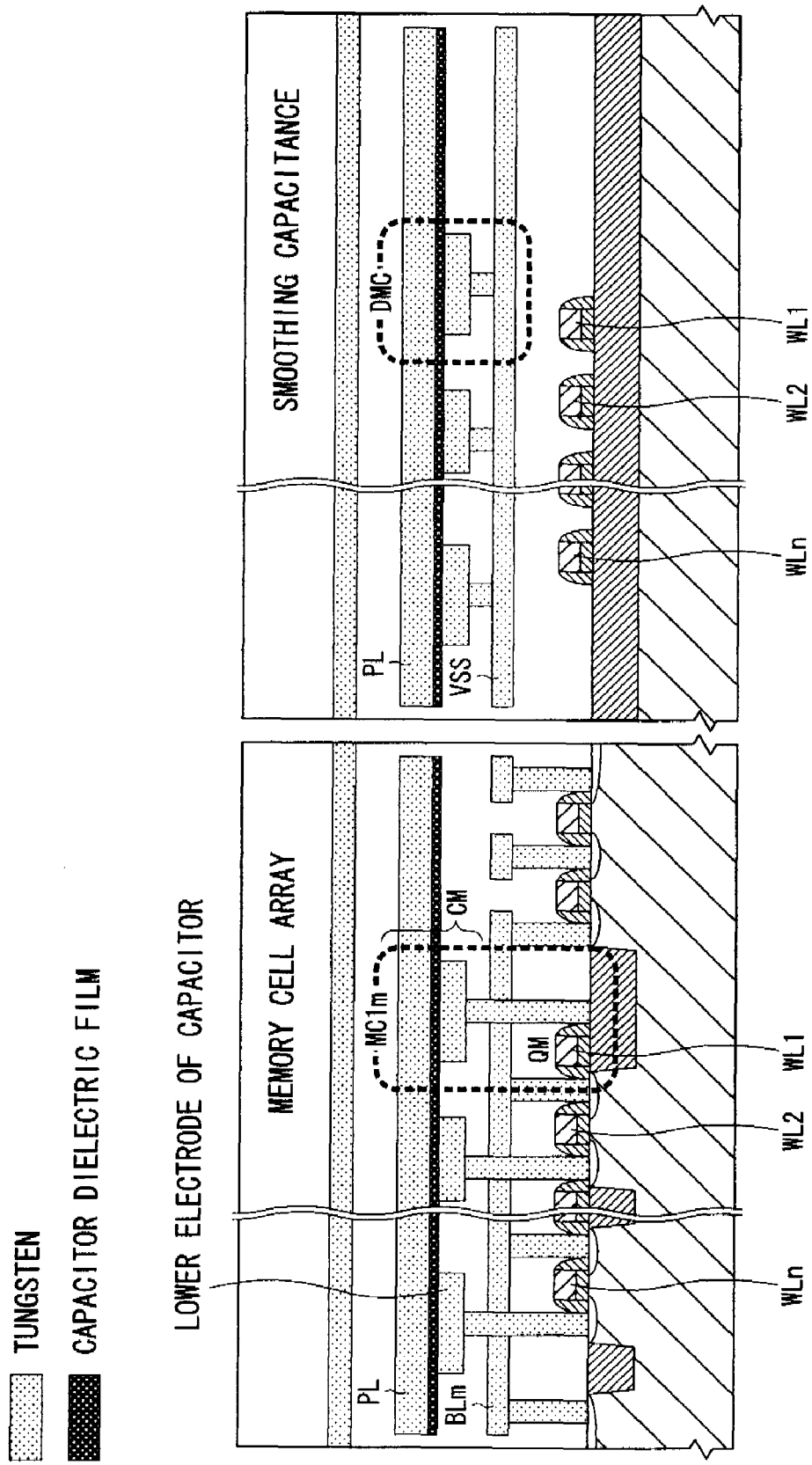

SEMICONDUCTOR MEMORY DEVICE

BACKGROUND OF THE INVENTION

1. Field of the Invention

The present invention relates to semiconductor memory devices including memory cell arrays in which data are read onto bit lines from memory cells and in which data are written into and refreshed in memory cells.

The present application claims priority on Japanese Patent Application No. 2008-167059, the content of which is incorporated herein by reference.

2. Description of Related Art

Various types of LSI devices incorporating dynamic random-access memories (DRAM) have been developed and disclosed in various documents such as Patent Documents 1 to 5, wherein various technologies have been developed to efficiently form smoothing capacitances and capacitances of logic circuits in small areas by use of capacitances of memory cells.

Patent Document 1: Japanese Unexamined Patent Application Publication No. 2003-332532
Patent Document 2: Japanese Unexamined Patent Application Publication No. H11-214649
Patent Document 3: Japanese Unexamined Patent Application Publication No. H05-174578
Patent Document 4: Japanese Unexamined Patent Application Publication No. 2000-348488
Patent Document 5: Japanese Unexamined Patent Application Publication No. 2005-167039

Patent Document 1 teaches a semiconductor device in which word lines and bit lines are shared between memory cell arrays, wherein a common terminal of bit lines is supplied with a power-supply potential VDD, a common cell plate terminal is supplied with a ground potential VSS, and a common terminal of word lines is supplied with a prescribed potential higher than the power-supply potential VDD by a threshold voltage of a MOS transistor (for selecting a memory cell) or more, thus forming a smoothing capacitance between the power-supply potential VDD and the ground potential VSS by turning on the MOS transistor.

The technology of Patent Document 1 is disadvantageous in that smoothing effects decrease due to high-frequency noise occurring in the memory cell array because of the on-resistance of the MOS transistor connected in series with the smoothing capacitance. It includes an exclusive array exclusively devoted to the smoothing capacitance, which is hardly applied for the purpose of suppressing plate noise occurring between plate electrodes of the memory cell array. This is because, in the case of a large-scale DRAM, an actually operating memory cell array is normally distanced from an exclusive array devoted to the smoothing capacitance. Forming the exclusive array in addition to the memory cell array should increase the overall chip area.

Patent Document 2 teaches a consolidated semiconductor integrated circuit device in which a capacitor having the same constitution as a capacitor of a DRAM-cell is arranged in a logic circuit and is used as a smoothing capacitance or a capacitance of the logic circuit. This technology is hardly applied for the purpose of suppressing plate noise occurring in the memory cell array because the smoothing capacitance is not formed in the area of the memory cell array. This is because, in the case of a large-scale DRAM, an actually operating memory cell is normally distanced from the smoothing capacitance. Forming the smoothing capacitance in addition to the memory cell array should increase the overall chip area.

Other technologies have been developed to reduce noise of memory cell arrays by use of decoupling capacitors.

Patent Document 3 teaches a semiconductor device in which a power-supply line and a ground line for a sense amplifier of a memory cell array are formed in a comb-shape on mesh wiring, wherein they are formed in a nesting structure so as to efficiently form a decoupling capacitance between the power supply and the ground. However, this technology is hardly applicable to a decoupling capacitor formed between the cell plates because it cannot achieve a high smoothing effect due to the shortage of a wiring area.

Patent Document 4 teaches a semiconductor memory device in which electric charge is accumulated in a capacitance of a memory cell array and is used for a power supply driving a sense amplifier. This technology is capable of reducing a peak current in the power supply of the sense amplifier but is hardly applicable to a decoupling capacitor formed between the cell plates driven by a fixed power supply.

Further technologies have been developed to efficiently form decoupling capacitors by use of vacant areas of logic circuits.

Patent Document 5 teaches a semiconductor device in which a dummy gate used for the purpose of suppressing dispersions of measurements in processing is formed in a vacant area of a peripheral circuit so that the gate capacitance thereof is used as a decoupling capacitor between the power supply and the ground. However, this technology should increase parasitic resistance with the cell plates because the decoupling capacitor is formed outside the memory cell array. In other words, this technology cannot efficiently form a decoupling capacitor between the cell plates in a small area.

In the above circumstances, the present inventors have recognized that it is necessary to reduce noise occurring between the plates serving as the opposite electrodes of a capacitor when reading data onto bit lines from memory cells and when writing and refreshing data in memory cells.

SUMMARY

The invention seeks to solve the above problem, or to improve upon the problem at least in part.

In one embodiment, a semiconductor memory device is constituted of a memory cell array including a plurality of memory cells each including a field-effect transistor and a capacitor, wherein the gates of the field-effect transistors are connected to a plurality of word lines, the drains of the field-effect transistors are connected to the first electrodes of the capacitors, and the sources of the field-effect transistors are connected to a plurality of bit lines, a plurality of word line drivers connected to the distal ends of the word lines so as to drive the word lines, a plurality of sense amplifiers connected to the distal ends of the bit lines so as to amplify read signals read from the memory cells onto the bit lines, and a plurality of first dummy capacitors which are disposed in a first boundary between the memory cell array and the word line drivers and/or a second boundary between the memory cell array and the sense amplifiers. Herein, the first electrodes of the first dummy capacitors are connected together and are supplied with a first potential, and the second electrodes of the capacitors are connected together with the second electrodes of the first dummy capacitors and are supplied with a second potential.

In another embodiment, a semiconductor memory device is constituted of a plurality of memory cells each including a capacitor and a field-effect transistor, a memory cell array including the memory cells which are connected together in a matrix-arrangement, and a plurality of first dummy capacitors which are aligned in at least one boundary within the outermost periphery of the memory cell array. Herein, the first electrodes of the capacitors are coupled with the field-effect transistors in the memory cells; the first electrodes of the first dummy capacitors are connected together and are supplied with a first potential; and the second electrodes of the first dummy capacitors are connected together with the second electrodes of the capacitors of the memory cells and are supplied with a second potential.

BRIEF DESCRIPTION OF THE DRAWINGS

The above features and advantages of the present invention will be more apparent from the following description of certain preferred embodiments taken in conjunction with the accompanying drawings, in which:

FIG. 2A is a cross-sectional view showing a part of a memory cell array according to a first fabrication manner;

FIG. 2B is a cross-sectional view showing a smoothing capacitance using a dummy capacitor according to the first fabrication manner;

DETAILED DESCRIPTION OF PREFERRED EMBODIMENTS

The present invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
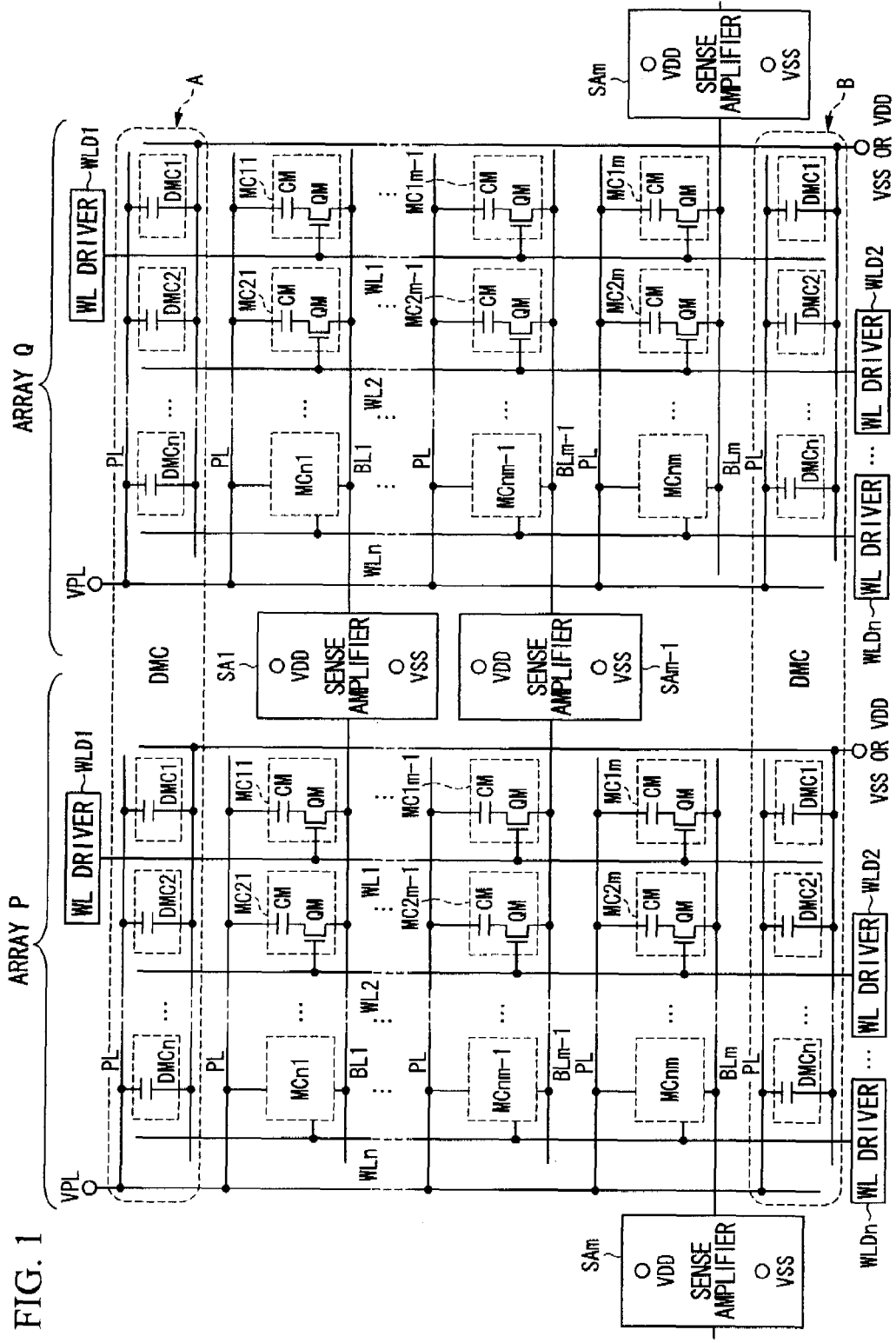
FIG. 1 is a circuit diagram showing the constitution of a semiconductor memory device according to a preferred embodiment of the present invention.

FIG. 1 is a circuit diagram showing a semiconductor memory device according to a preferred embodiment of the present invention, which is a part of a dynamic random-access memory (DRAM) including memory cell arrays and dummy capacitors serving as smoothing capacitances for a plate power-supply VPL. Specifically, the semiconductor memory device of FIG. 1 includes two adjacent memory cell arrays P and Q.

Each of the memory cell arrays P and Q includes "n" (where "n" is a natural number) word lines WL1 to WLn, "m" (where "m" is a natural number) bit lines BL1 to BLm, m×n memory cells MC11 to MCnm (which are connected at intersections between the word lines WL1-WLn and the bit lines BL1-BLm), word line drivers (referred to as WL drivers) for selectively driving the word lines WL1-WLn, and sense amplifiers SA1 to Sam for amplifying read signals on the bit lines BL1-BLm.

Each of the memory cell arrays P and Q further includes dummy capacitors DMC1 to DMCn in connection with the word lines WL1 to WLn and the WL drivers WLD1 to WLDn. The dummy capacitors DMC1 to DMCn form smoothing capacitances for the plate power-supply VPL.

The word lines WL1 to WLn perpendicularly intersect with the bit lines BL1 to BLm. The m×n memory cells MC11 to MCnm are aligned in an array-arrangement in each of the memory cell arrays P and Q.

The "array-arrangement" embraces a two-dimensional matrix arrangement consisting of rows and columns and a one-dimensional linear arrangement. The m×n memory cells MC11 to MCnm are not necessarily aligned in a regular arrangement such as the array-arrangement. Alternatively, it is possible to align the memory cells MC11 to MCnm in a zigzag-arrangement or in an irregular or asymmetrical arrangement.

The WL drivers WLD1 to WLDn are alternately arranged and connected to the upper/lower ends of the word lines WL1 to WLn. For example, the WL drivers WLD1, WLD3, . . . are connected to the upper ends of the word lines WL1, WL3, . . . , while the WL drivers WLD2, WLD4, . . . are connected to the lower ends of the word lines WL2, WL4, . . . .

In each memory cell array, the WL drivers WLD1 to WLDn are alternately connected to the upper/lower ends of the word lines WL1 to WLn so that they are alternately disposed in the upper/lower areas A and B; hence, the dummy capacitors DMC1 to DMCn are disposed in the upper/lower areas A and B.

The sense amplifiers SA1 to SAm are alternately connected to the right/left ends of the bit lines BL1 to BLm in each memory cell array.

Each memory cell array employs an open-bit configuration so that the sense amplifiers SA1 to SAm are each shared by the adjacent memory cell arrays in connection with the bit lines BL1 to BLm.

Each of the memory cells MC11 to MCnm includes a MOS transistor QM and a capacitor CM for storing data, wherein the first electrodes of the capacitors CM are coupled with the drains of the MOS transistors QM respectively. The second electrodes of the capacitors CM are connected together so as to form plate electrodes PL in connection with the plate power-supply VPL in each memory cell array.

The first electrodes of the dummy capacitors DMC1 to DMCn are connected together and are supplied with a power-supply potential VDD or a ground potential VSS in each memory cell array. The second electrodes of the dummy capacitors DMC 1 to DMCn are connected together so as to form plate electrodes PL, which are associated with the plate electrodes PL of the capacitors CM of the memory cells MC11 to MCnm in connection with the plate power-supply VPL.

The plate electrodes PL are supplied with a midpoint potential between the power-supply potential VDD and the ground potential VSS by the plate power-supply VPL. In each memory cell array, the dummy capacitors DMC1 to DMCn collectively form smoothing capacitances for the plate power-supply VPL.

Each of the sense amplifiers SA1 to SAm is supplied with the power-supply potential VDD and the ground potential VSS so as to set a high potential or a low potential to each of the capacitors CM. Since the voltage applied to each smoothing capacitance for the plate power-supply VPL is identical to the voltage supplied to each capacitor CM, it is possible to secure a high reliability with respect to the smoothing capacitances, similar to the memory cells MC11 to MCnm.

FIGS. 2A and 2B show a first fabrication manner for the memory cell array and the smoothing capacitance (using the dummy capacitor DMC) for the plate power-supply VPL, wherein the MOS transistor QM included in the memory cell MC is a planar transistor.

FIG. 2A is a cross-sectional view showing a part of the memory cell array in which the first electrode (or lower electrode) of the capacitor CM is connected to the drain of the MOS transistor QM via a plug. The second electrode of the capacitor CM is connected to the plate electrode PL shared with other capacitors. The source of the MOS transistor QM is connected to the bit line BLm via a plug.

FIG. 2B is a cross-sectional view showing the dummy capacitor DMC disposed in the boundary between the memory cell MC and the WL driver WLD, wherein the first electrode (or lower electrode) of the dummy capacitor DMC is connected to the ground potential VSS. The second electrode of the dummy capacitor DMC is connected to the plate electrode PL shared with other dummy capacitors. Both the capacitor CM and the dummy capacitor DMC are produced with the same size in manufacturing.

In the above, the lower electrode of the dummy capacitor DMC is required to form the lower electrode of the capacitor CM in a desired shape. Specifically, the capacitor layer used for forming the capacitor CM is formed in a longitudinal structure and is positioned above the transistor layer used for forming the MOS transistor QM. As shown in FIG. 2A, other transistors are not formed in proximity to the capacitor CM of the memory cell MC but are formed in proximity to the MOS transistor QM located in the outermost periphery of the memory cell array. In this point, the dummy capacitor DMC is required to form the capacitor CM adjoining thereto, wherein the dummy capacitor DMC may increase the capacitance of the capacitor CM.

Figures 3A, 3B:
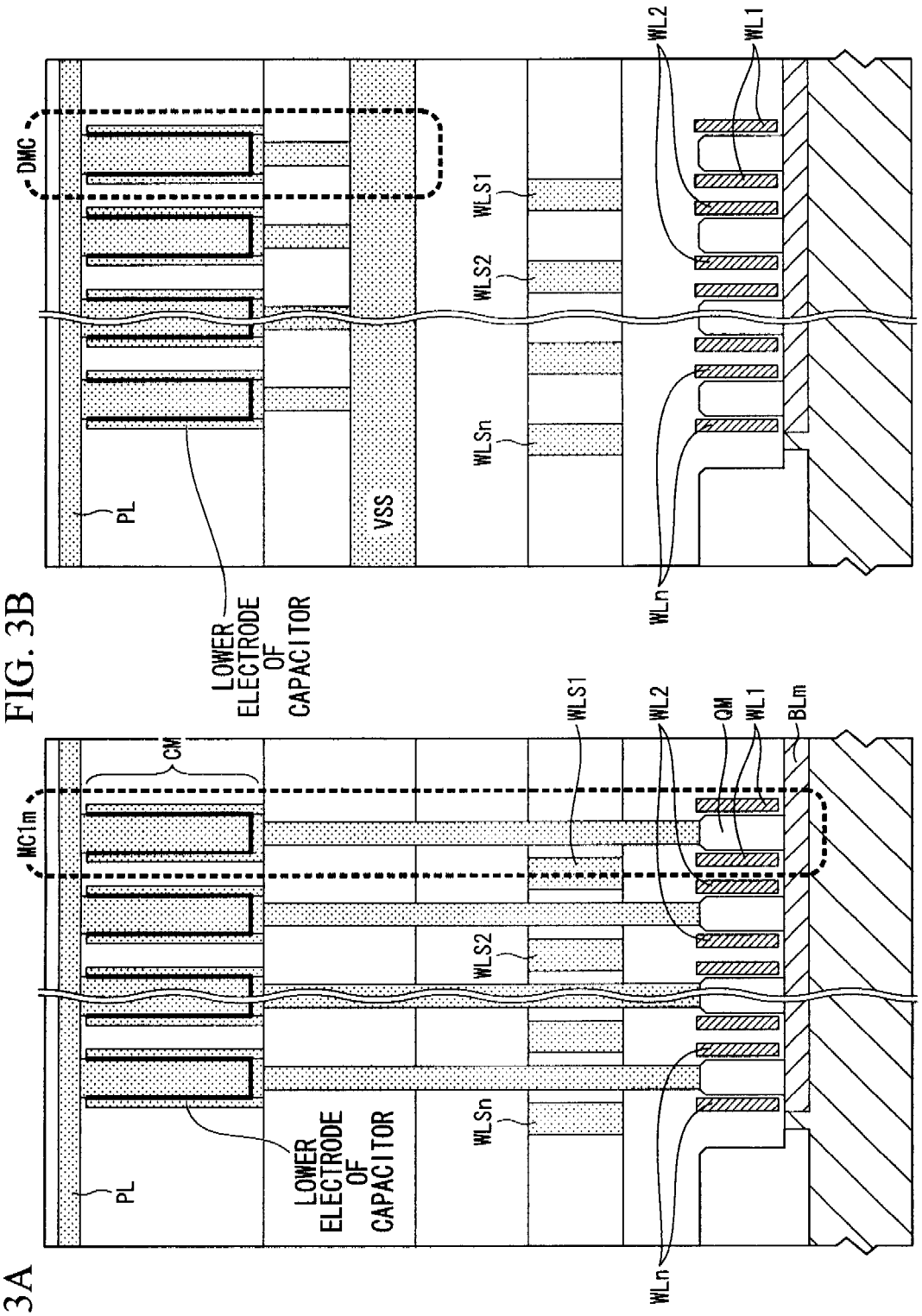
FIG. 3A is a cross-sectional view showing a part of a memory cell array according to a second fabrication manner.
FIG. 3B is a cross-sectional view showing a smoothing capacitance using a dummy capacitor according to the second fabrication manner.

FIGS. 3A and 3B show a second fabrication manner for the memory cell array and the smoothing capacitance (using the dummy capacitor DMC) for the plate power-supply VPL, wherein the MOS transistor QM included in the memory cell MC is a surround-gate vertical transistor.

FIG. 3A is a cross-sectional view showing a part of the memory cell array in which the first electrode (or lower electrode) of the capacitor CM is connected to the drain of the MOS transistor QM (corresponding to the upper diffusion layer) via a plug. The second electrode of the capacitor CM is connected to the plate electrode PL shared with other capacitors. The source of the MOS transistor QM is connected to the bit line BL disposed therebelow.

FIG. 3B is a cross-sectional view showing the dummy capacitor DCM formed in the boundary between the memory cell MC and the WL driver WLD, wherein the first electrode (or lower electrode) of the dummy capacitor DMC is connected to the ground potential VSS via a plug. The second electrode of the dummy capacitor DMC is connected to the plate electrode PL shared with other dummy capacitors. Both the capacitor CM and the dummy capacitor DMC are formed with the same size in manufacturing.

As described above, the lower electrode of the dummy capacitor DMC is required to form the lower electrode of the capacitor CM in a desired shape.

Figure 4:
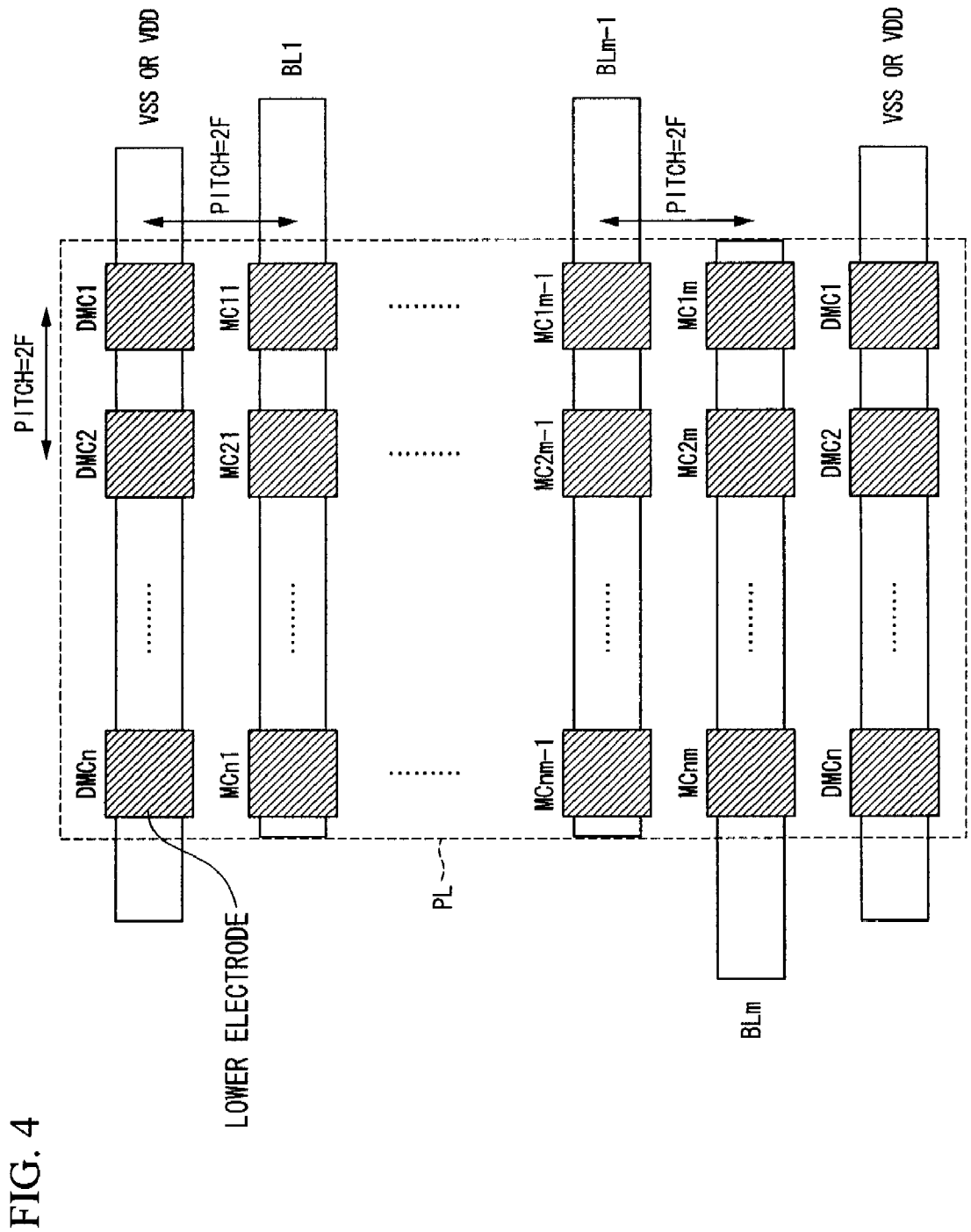
FIG. 4 is a plan view showing a first layout for the lower electrodes of the dummy capacitors and the lower electrodes of the capacitors of the memory cells.

FIG. 4 shows a first layout for the dummy capacitors DMC1 to DMCn and the capacitors CM of the memory cells MC11 to MCnm in connection with the bit lines BL, the plate electrodes PL, and the lines of VDD or VSS, wherein both the dummy capacitors DMC and the capacitors CM are formed with the same size, and the lower electrodes thereof are aligned along the word lines WL and the bit lines BL in an array-arrangement with the same pitch of 2F (where F denotes a minimum dimension corresponding to a half the gate pitch). Specifically, the lower electrodes of the dummy capacitors DMC are collectively disposed in each of the upper and lower area of the memory cell array while the lower electrodes of the capacitors CM are formed in other areas.

When another pattern not having a fine structure is formed around the first layout having a fine structure in which the lower electrodes of the dummy capacitors DMC and the capacitors CM are regularly aligned with small pitches therebetween, the lower electrodes formed in the boundary may be easily deformed due to optical effects of lithography and due to micro-loading effects of dry etching. For this reason, a dummy pattern is formed in the boundary so as to prevent the deformation of the lower electrodes of the capacitors CM of the memory cells MC. Since the present embodiment utilizes the dummy pattern as the smoothing capacitance for the plate power-supply VPL, it is possible to effectively reduce plate noise without substantially increasing the overall chip area.

Figure 5:
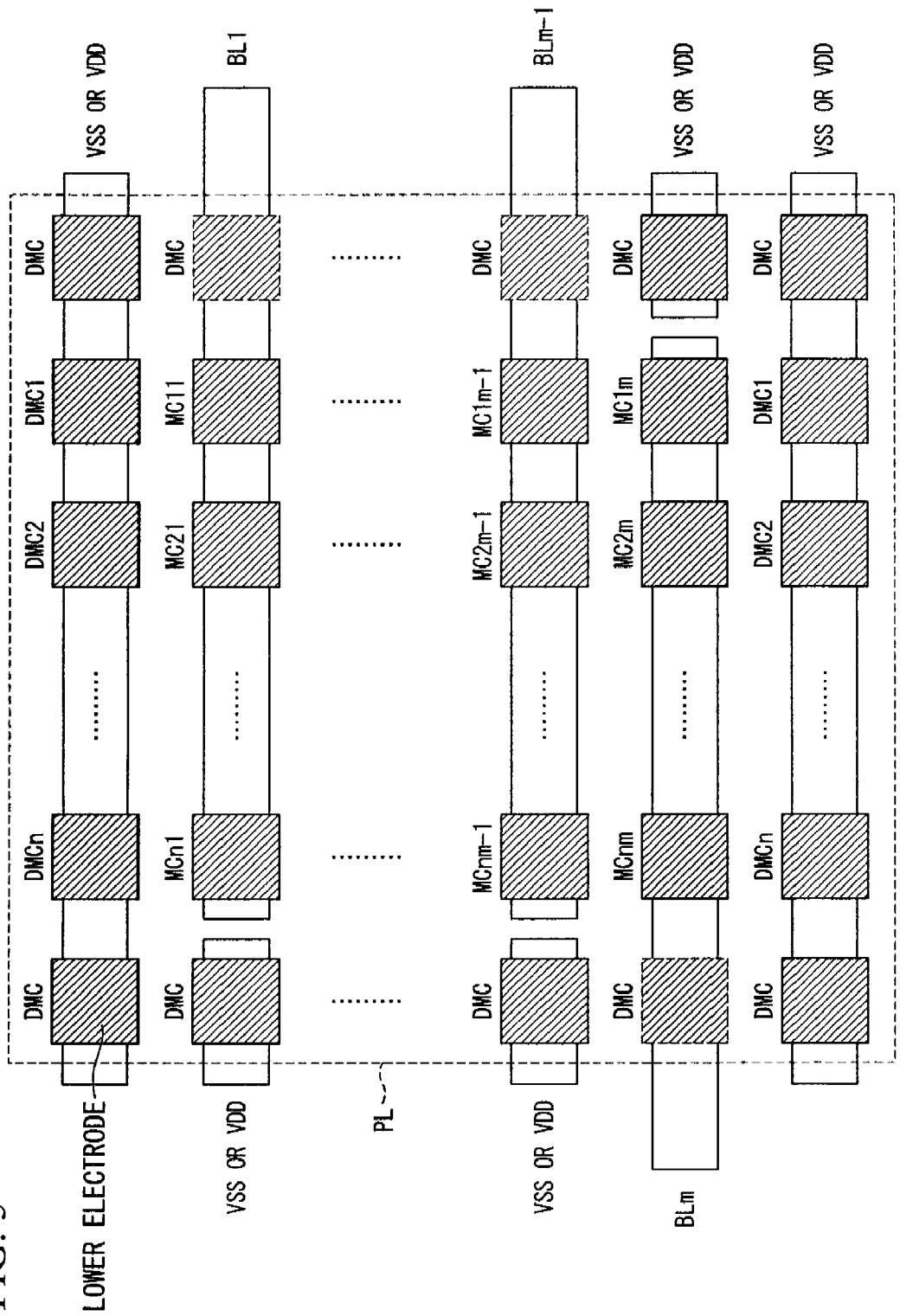
FIG. 5 is a plan view showing a second layout for the lower electrodes of the dummy capacitors and the lower electrodes of the capacitors of the memory cells.

FIG. 5 shows a second layout for the dummy capacitors DMC1 to DMCn and the capacitors CM of the memory cells MC11 to MCnm in connection with the bit lines BL, plate electrodes PL, and the lines of VDD or VSS, wherein both the dummy capacitors DMC and the capacitors CM are formed with the same size, and the lower electrodes thereof are aligned in an array-arrangement with the same pitch of 2F therebetween. That is, the dummy capacitors DMC are formed in the outermost periphery of the memory cell array and are aligned with the same pitches as the memory cells MC aligned in a matrix-arrangement consisting of rows and columns. The lower electrodes of the dummy capacitors DMC are aligned in connection with the bit lines BL and the word lines WL in the upper and lower areas (corresponding to the boundaries between the memory cell array and the WL drivers) and in the right and left areas (corresponding to the boundaries between the memory cell array and the sense amplifiers SA), while the lower electrodes of the capacitors CM are aligned in other areas.

In the case of the first fabrication manner shown in FIGS. 2A and 2B in which the memory cell MC uses a planar transistor as the MOS transistor QM, the lower electrode of the dummy capacitor DMC is not connected to the bit line BL via a plug in the dummy pattern. In the case of the second fabrication manner shown in FIGS. 3A and 3B in which the memory cell MC uses a vertical transistor as the MOS transistor QM, the lower electrode of the dummy capacitor DMC is connected to the line of VDD or VSS via a plug.

In this connection, the dummy capacitors DMC encompassed in dotted blocks are not connected to the bit lines BL in FIG. 5.

Since the dummy pattern is formed in the outermost periphery (or boundary) of the memory cell array, it is possible to completely prevent the deformation of the lower electrodes of the capacitors CM of the memory cells MC. In addition, since the dummy pattern is utilized as the smoothing capacitance for the plate power-supply VPL, it is possible to effectively reduce plate noise without substantially increasing the overall chip area. In particular, the present embodiment is characterized in that the lower electrodes of the dummy capacitors DMC are disposed in the rectangular corners of the memory cell array, i.e. the cross areas formed between the upper/lower areas (corresponding to the boundaries with the WL drivers WLD) and the right/left areas (corresponding to the boundaries with the sense amplifiers SA).

Variations of dummy pattern layouts for disposing dummy capacitors DMC in a single unit of the memory cell array will be described with reference to FIGS. 6A to 6D.

Figure 6A:
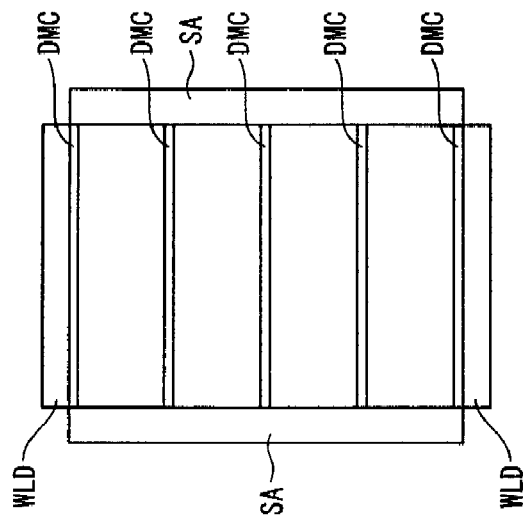
FIG. 6A is an illustration showing a first dummy pattern layout for disposing dummy capacitors in a single unit of the memory cell array.

FIG. 6A shows a first dummy pattern layout in which the dummy capacitors DMC are disposed in the upper/lower areas of the memory cell array as shown in FIG. 4.

Figure 6B:
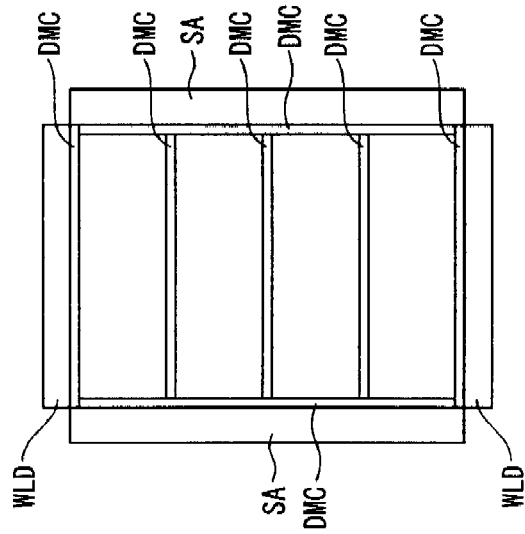
FIG. 6B is an illustration showing a second dummy pattern layout for disposing dummy capacitors in a single unit of the memory cell array.

FIG. 6B shows a second dummy pattern layout in which the dummy capacitors DMC are disposed in the upper/lower areas and the right/left areas of the memory cell array as shown in FIG. 5.

Figure 6C:
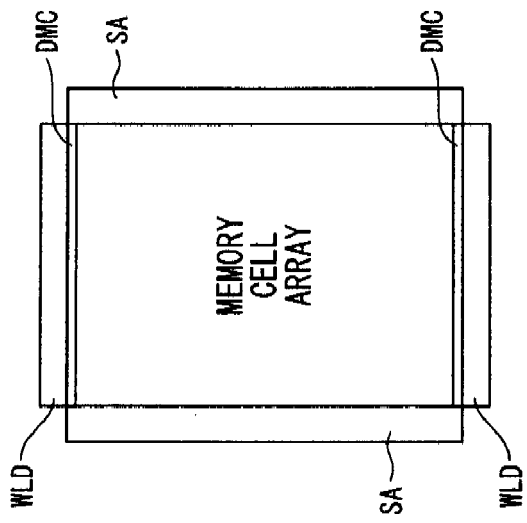
FIG. 6C is an illustration showing a third dummy pattern layout for disposing dummy capacitors in a single unit of the memory cell array.

FIG. 6C shows a third dummy pattern layout in which the dummy capacitors DMC are further aligned along bit lines BL in addition to the dummy capacitors DMC disposed in the upper/left areas of the memory cell array shown in FIG. 6A.

Figure 6D:
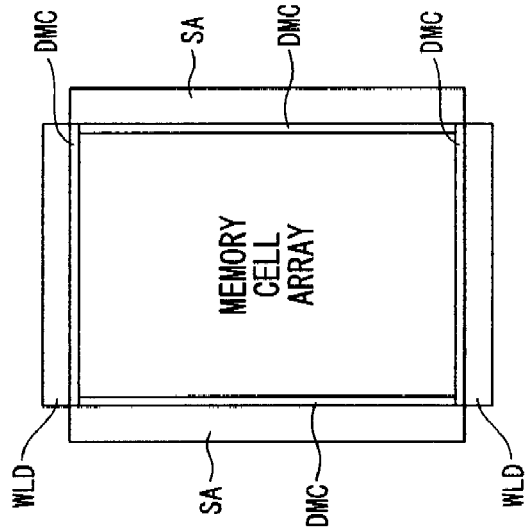
FIG. 6D is an illustration showing a fourth dummy pattern layout for disposing dummy capacitors in a single unit of the memory cell array.

FIG. 6D shows a third dummy pattern layout in which the dummy capacitors DMC are further aligned along bit lines BL in addition to the dummy capacitors DMC disposed in the upper/lower and right/left areas of the memory cell array shown in FIG. 6B.

In all the dummy pattern layouts shown in FIGS. 6A to 6D, the memory cell array is formed in the center area, so that the WL drivers WLD are disposed in the upper/lower ends of the memory cell array, while the sense amplifiers SA are disposed in the right/left ends of the memory cell array.

Specifically, in the first dummy pattern layout shown in FIG. 6A, the dummy capacitors DMC are disposed in the upper/lower boundaries formed between the WL drivers WLD and the memory cell array. That is, the dummy capacitors DMC are linearly aligned along two opposite sides of the memory cell array.

In the second dummy pattern layout shown in FIG. 6B, the dummy capacitors DMC are disposed in the upper/lower boundaries formed between the WL drivers WLD and the memory cell array and in the right/left boundaries formed between the sense amplifiers SA and the memory cell array. That is, the dummy capacitors DMC are linearly aligned along four sides of the memory cell array.

In the third dummy pattern layout shown in FIG. 6C which further incorporates the dummy capacitors DMC into the first dummy pattern layout shown in FIG. 6A, the memory cell array is divided into a plurality of memory blocks along the bit lines BL connected with the sense amplifiers SA, wherein the dummy capacitors DMC are linearly aligned in boundaries between the adjacent memory blocks. In other words, the dummy capacitors DMC are aligned in plural lines parallel to the alignment of the WL drivers WLD along the bit lines BL.

In the fourth dummy pattern layout shown in FIG. 6D which further incorporates the dummy capacitors DMC into the second dummy pattern layout shown in FIG. 6B, wherein the memory cell array is divided into a plurality of memory blocks along the bit lines BL, so that the dummy capacitors DMC are linearly aligned in the boundaries between the adjacent memory blocks.

The above dummy pattern layouts can effectively reduce plate noise. In the case of the first fabrication manner shown in FIG. 3 in which a vertical transistor is used as the MOS transistor QM of the memory cell MC and in which word shunt lines WLS1-WLSn composed of tungsten are used to reduce resistances of the word lines WL1-WLn, it is necessary to accommodate an area for wiring both the word lines WL and the word shunt lines WLS. In this case, it is possible to dispose the dummy capacitors DMC in such an area, thus forming a large smoothing capacitance without substantially increasing the overall chip area.

In the present embodiment and its variations, the dummy capacitors DMC are linearly aligned in each line, whereas it is possible to increase the number of lines for aligning the dummy capacitors DMC as necessarily. It is possible to use fin-shaped transistors and trench-shaped transistors as the transistors QM of the memory cells MC. It is possible to use various types of capacitors such as crown capacitors and trench capacitors.

In addition, the present embodiment may require field-effect transistors (FET) as the transistors QM of the memory cells MC, wherein it is possible to use various types of field-effect transistors metal-insulator semiconductor (MIS) transistors other than metal-oxide semiconductor (MOS) transistors. Furthermore, it is possible to use P-channel field-effect transistors and N-channel field-effect transistors (referred to as first-conduction-type transistors and second-conduction-type transistors).

As described above, the present invention demonstrates the following effects.

(1) The present invention is directed to a dynamic random-access memory (DRAM) including a plurality of memory cell arrays equipped with smoothing capacitances for the plate power-supply VPL, wherein it is possible to achieve a high noise reduction effect because the noise source is positioned close the smoothing capacitance so as to reduce the parasitic capacitance.

(2) The smoothing capacitance is formed using the dummy capacitors DMC which are disposed in the boundary between the WL drivers WLD and the memory cell array and/or in the boundary between the sense amplifiers SA and the memory cell array and which are used to absorb (or cancel out) dispersions of measurements due to lithography and dry etching. That is, the present invention does not require an additional area used for forming the smoothing capacitance, thus effectively reducing noise without increasing the overall chip area.

(3) Since the smoothing capacitance is formed using the existing capacitors in the memory cell array, it is possible to achieve a large capacitance per unit area and to thereby form a sufficiently large smoothing capacitance in a small area.

(4) Since a relatively low voltage (e.g. approximately a half the amplitude of potential applied to each bit line BL) is applied to the smoothing capacitance similar to other capacitors of memory cells, it is possible to secure a high reliability in the performance of the smoothing capacitance.

Lastly, it is apparent that the present invention is not limited to the above embodiments, but may be modified and changed without departing from the scope and spirit of the invention.

What is claimed is:

1. A semiconductor memory device comprising:
a memory cell array including a plurality of memory cells each including a field-effect transistor and a capacitor, wherein gates of the field-effect transistors are connected to a plurality of word lines, drains of the field-effect transistors are connected to first electrodes of the capacitors, and sources of the field-effect transistors are connected to a plurality of bit lines;
a plurality of word line drivers connected to distal ends of the word lines so as to drive the word lines;
a plurality of sense amplifiers connected to distal ends of the bit lines so as to amplify read signals read from the memory cells onto the bit lines; and
a plurality of first dummy capacitors which are disposed in a first boundary between the memory cell array and the word line drivers and/or a second boundary between the memory cell array and the sense amplifiers, wherein first electrodes of the first dummy capacitors are connected together and are supplied with a first potential, and wherein second electrodes of the capacitors are connected together with second electrodes of the first dummy capacitors and are supplied with a second potential.

2. The semiconductor memory device according to claim 1, wherein the first dummy capacitor is formed with the same size as the capacitor of the memory cell, so that the first dummy capacitors are aligned with same pitches as the capacitors of the memory cells therebetween.

3. The semiconductor memory device according to claim 1, wherein the first dummy capacitors aligned in the first boundary and/or the second boundary are used to form a dummy pattern for absorbing dispersions of measurements occurring in lower electrodes of the capacitors of the memory cells.

4. The semiconductor memory device according to claim 3, wherein the lower electrodes of the capacitors of the memory cells are formed by way of lithography or dry etching.

5. The semiconductor memory device according to claim 3, wherein the first dummy capacitors are aligned in cross areas at which the first boundary crosses the second boundary.

6. The semiconductor memory device according to claim 1, wherein the first potential is identical to either a third potential which is lower than the second potential or a fourth potential which is higher than the second potential, and wherein the second potential is a midpoint potential between the third potential and the fourth potential.

7. The semiconductor memory device according to claim 6, wherein the third potential corresponds to a low level which is applied to the first electrode of the capacitor of the memory cell, and wherein the fourth potential corresponds to a high level which is applied to the first electrode of the capacitor of the memory cell.

8. The semiconductor memory device according to claim 1, wherein the field-effect transistors of the memory cells are formed in a transistor layer, while the capacitors of the memory cells are formed in a capacitor layer, and wherein the capacitor layer has a longitudinal structure formed at a position which differs from a position of the transistor layer.

9. The semiconductor memory device according to claim 8, wherein the first electrodes of the dummy capacitors are formed in the transistor layer, and wherein a first line supplied with the first potential is formed between the transistor layer and the capacitor layer.

10. The semiconductor memory device according to claim 1 further comprising a plurality of second dummy capacitors aligned in a third boundary between memory blocks which are divided from the memory cell array along the bit line, wherein first electrodes of the second dummy capacitors are connected together and are supplied with the first potential, while second electrodes of the second dummy capacitors are connected together with the second electrodes of the capacitors of the memory cells and are supplied with the second potential.

11. The semiconductor memory device according to claim 10, wherein the second dummy capacitor is formed with a same structure with the first dummy capacitor, so that the second dummy capacitors are aligned with same pitches as the first dummy capacitors therebetween.

12. The semiconductor memory device according to claim 10, wherein the first potential is identical to either a third potential which is lower than the second potential or a fourth potential which is higher than the second potential, and wherein the second potential is a midpoint potential between the third potential and the fourth potential.

13. The semiconductor memory device according to claim 12, wherein the third potential corresponds to a low level which is applied to the first electrode of the capacitor of the memory cell, and wherein the fourth potential corresponds to a high level which is applied to the first electrode of the capacitor of the memory cell.

14. The semiconductor memory device according to claim 1, wherein the word lines perpendicularly cross the bit lines.

15. A semiconductor memory device comprising:
a plurality of memory cells each including a capacitor and a field-effect transistor;
a memory cell array including the plurality of memory cells which are connected together in a matrix-arrangement; and
a plurality of first dummy capacitors which are aligned in at least one boundary within a outermost periphery of the memory cell array,
wherein first electrodes of the capacitors are coupled with the field-effect transistors in the memory cells,
wherein first electrodes of the first dummy capacitors are connected together and are supplied with a first potential, and
wherein second electrodes of the first dummy capacitors are connected together with second electrodes of the capacitors of the memory cells and are supplied with a second potential.

16. The semiconductor memory device according to claim 15, wherein the field-effect transistors of the memory cells are formed in a transistor layer, while the capacitors of the memory cells are formed in a capacitor layer, and wherein the capacitor layer has a longitudinal structure formed at a position which differs from a position of the transistor layer.

17. The semiconductor memory device according to claim 16, wherein the first electrodes of the dummy capacitors are formed in the transistor layer, and wherein a first line supplied with the first potential is formed between the transistor layer and the capacitor layer.

18. The semiconductor memory device according to claim 15 further comprising a plurality of second dummy capacitors aligned in a boundary between memory blocks which are divided from the memory cell array along the bit line, wherein the second dummy capacitor is formed with a same structure as the first dummy capacitor, and wherein first electrodes of the second dummy capacitors are connected together and are supplied with the first potential, while second electrodes of the second dummy capacitors are connected together with the second electrodes of the capacitors of the memory cells and are supplied with the second potential.

19. The semiconductor memory device according to claim 18, wherein the first potential is identical to either a third potential which is lower than the second potential or a fourth potential which is higher than the second potential, and wherein the second potential is a midpoint potential between the third potential and the fourth potential.

20. The semiconductor memory device according to claim 19, wherein the third potential corresponds to a low level which is applied to the first electrode of the capacitor of the memory cell, and wherein the fourth potential corresponds to a high level which is applied to the first electrode of the capacitor of the memory cell.

* * * * *